United States Patent [19]

Bulucea et al.

[11] Patent Number: 5,866,931

[45] Date of Patent: *Feb. 2, 1999

[54] DMOS POWER TRANSISTOR WITH REDUCED NUMBER OF CONTACTS USING INTEGRATED BODY-SOURCE CONNECTIONS

[75] Inventors: Constantin Bulucea, Milpitas; Rebecca Rossen, Palo Alto, both of Calif.

[73] Assignee: Siliconix incorporated, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 777,636

[22] Filed: Dec. 31, 1996

Related U.S. Application Data

[60] Continuation of Ser. No. 411,049, Mar. 27, 1995, abandoned, which is a division of Ser. No. 47,723, Apr. 14, 1993, Pat. No. 5,410,170.

[51] Int. Cl.[6] .......................... H01L 29/76; H01L 29/94; H01L 31/062
[52] U.S. Cl. .......................... 257/331; 257/330; 257/332
[58] Field of Search .................................. 257/330, 331, 257/332

[56] References Cited

U.S. PATENT DOCUMENTS 5,072,266 12/1991 Bulucea et al. .................... 357/23.4
5,168,331 12/1992 Yilmaz ................................ 257/331
5,341,011 8/1994 Hshieh et al. ....................... 257/330

OTHER PUBLICATIONS

Constantin Bulucea and Rebecca Rossen, "Trench DMOS Transistor Technology for High–Current (100 A Range) Switching," Solid–State Electronics, vol. 34, No. 5, pp. 493–507, 1991.

Primary Examiner—Ngan V. Ngo
Attorney, Agent, or Firm—Skjerven, Morrill, MacPherson, Franklin & Friel; Edward C. Kwok

[57] ABSTRACT

Two topologically different cells are disclosed that reduce the total number of contacts per device and that are applicable to mid- to high-voltage DMOS transistors. These cells use integrated connections between the source and the body that make them less sensitive to contact obturations by particle contamination or lithography imperfections. The topologies include either an elongated hexagonal cell or a buried-deep-body cell. Both cells are most efficient in high-current medium-voltage trench DMOS transistors, where the density of body contacts becomes prohibitive while the perimeter/area geometry factor is less critical. The disclosed embodiments are of the trench type of DMOS construction. The cells may, however, be implemented in planar DMOS transistors as well.

7 Claims, 12 Drawing Sheets

$k = (1/2) \tan (30 \deg) = \text{sqrt} (3) / 6$
$A = \text{area} \ (A\ B\ C\ D\ E\ F\ A) = k\ (a + b)^2 + (a + b)\ h$
$Z = \text{perim} \ (A1\ B1\ C1\ D1\ E1\ F1\ A1) = 8ka + 2\ (h - 2kb)$

DMOS POWER TRANSISTOR WITH REDUCED NUMBER OF CONTACTS USING INTEGRATED BODY-SOURCE CONNECTIONS

This application is a continuation of application Ser. No. 08/411,049, filed Mar. 27, 1995, now abandoned, which is a division of application Ser. No. 08/047,723, filed Apr. 14, 1993, now U.S. Pat. No. 5,410,170.

BACKGROUND OF THE INVENTION

1. Field of the Invention

This invention relates to power switching transistors and more particularly to DMOS transistors.

2. Description of the Relevant Art

DMOS transistors of either trench or planar construction are most typically made from an array of small transistors, called "microcells" or simply "cells," connected in parallel. Each microcell has all the material layers and contacts required to make a complete transistor. The cell construction is governed by the desire to maximize the cell's perimeter (Z) for a given cell area (A), or, in other terms, the perimeter/area (Z/A) ratio. Maximization of the Z/A ratio results in the minimization of the specific on-resistance (the resistance per unit area) of the transistor, $r_{ds(on)} \times A$, defined as $$r_{ds(on)} \times A = (g_{ds(on)}/A)^{-1}, \qquad (1)$$

where $g_{ds(on)}$ is the linear region drain-source conductance.

Various microcell geometries are possible, of which the square and hexagonal microcell geometries are most frequently used. The perimeter to area Z/A ratio for either the square or the hexagonal microcells is $$Z/A = (4a)/(a+b)^2, \qquad (2)$$

where a is the width of the silicon opening and b is the width of the trench (in a trench design) or the polysilicon (in a planar design).

FIG. 1 illustrates half a hexagonal trench microcell 5. The structure includes an n+ substrate 50, on which is grown a lightly doped n-type epitaxial layer 40. Within the epitaxial layer 40, a body region 30 of p or p+ conductivity is provided. Another n+ layer 20 overlying most of the body region 30 serves as a source region. A hexagonally shaped trench 10 is provided in the epitaxial layer and extends downward from the top surface of the cell into the epitaxial layer 40. Body region 30 is formed in epitaxial region 40 such that its deepest point is positioned below the deepest point of trench 10.

The body region 30 opens to the top surface of the epitaxial layer 40 and forms an exposed portion 60 in a horizontal cross section at the top surface of the cell. Exposed portion 60 of the body region is more heavily doped (p+) than the substantially planar remainder of the body region. The three-dimensional geometry of this hexagonal trench microcell 5 including the 120° angles of the hexagonal shape improves the uniformity of the electric field in the gate oxide, compared with the uniformity of the electric field in the gate oxide of a square trench microcell, which is characterized by 90° angles. The improved uniformity in the gate oxide electric field improves the gate breakdown voltage. As the angle of the microcell increases, the electric field in the gate oxide field more closely approaches that of a plane in which the uniformity of the gate oxide field is maximized. Moreover, during the process of creating the trench, the corners and sides become rounded thereby further reduce the rigidity of the angle, which, in turn, increases the uniformity of the field.

FIG. 2 shows a simplified three-dimensional representation of a square planar microcell 80. The microcell 80 includes an epitaxial layer 110 formed on a substrate 100. Also illustrated is a body region 120, a source region 130, an insulating oxide layer 140 and a source metallization layer 150. The planar microcell 80 is most typically designed in square rather than in hexagonal geometry, for computer-aided-design (CAD) convenience. Unlike the hexagonal trench structure shown in FIG. 1, a planar design, such as shown in FIG. 2, derives no benefit from the hexagonal geometry. Also, no advantage is associated with using offset cell placement (e.g. where the cells are positioned in a staggered fashion as illustrated in FIG. 2), instead of in-line cell placement (positioned in a straight line).

The hexagonal and the square cells illustrated in FIGS. 1 and 2 are usually referred to as "closed" cells. Another cell type, the "open" cell, will be later described in further detail.

The perimeter to area (Z/A) relationship given above describes a non-monotonic function of the width of the silicon opening a when the width b of the trench or the width b of the polysilicon is kept constant. This non-monotonic function has a maximum value of $$(Z/A)_{max} = 1/b, \qquad (3)$$

when a=b (in other words, when the width of the silicon opening a is equal to the width b of the trench in a trench design or the width b of the polysilicon in a polysilicon design).

FIG. 3 shows perimeter to area (Z/A) plots as a function of the silicon opening a and the polysilicon width b for the respective typical open and closed cells of trench and planar construction. As shown in FIG. 3, curve 301 traces the Z/A ratio versus silicon opening width a for a trench closed cell having a trench width of 2.5 μm. Curve 302 traces the Z/A ratio versus silicon opening width a for a planar closed cell having a polysilicon width of 9 μm. Also, curves 303–308 trace the Z/A ratio versus silicon opening width a for trench open cells (discussed later) having $c_1/Z_1$ ratios between 0 and 0.5; the parameters $c_1$ and $Z_1$ are defined in FIG. 4. The circles in FIG. 3 designate the approximate state-of-the-art for the respective cell designs.

In both planar and trench designs, the dimensions of the central part of the microcell (deep-body, source implant and contact regions) are limited to the minimum size achievable with the available technology. For example, dimension a has a minimum value that is set by the lithography rules.

The perimeter (Z) of a microcell, which is defined by the gate region of the cell, is minimized in a trench design. The minimum cell perimeter Z cannot be reached in a planar design due to the JFET (junction field effect transistor) current constriction associated with such designs. Hence, under current technology, dimension b is around 2 micrometers in a trench design and from 6 to 40 micrometers in a planar design. A planar design requires a larger width because of the larger breakdown voltage specifications required.

It follows from this discussion that a trench design results in a larger perimeter to area Z/A ratio. Consequently, a trench design provides the maximum perimeter achievable with currently available technology.

FIG. 4 is an illustration of an open cell. An open cell (also called a stripe, or linear, cell) can be seen as an in-line square cell, one side of which is stretched out, such that it becomes much larger than the other side. Thus, the contributions to the Z/A ratio by the small sides are relatively insignificant, so that the Z/A ratio of an open cell can be written as:

$$Z/A=2/(a+b), \quad (4)$$

which is a monotonic function of a when b are kept constant. Thus, $$(Z/A)_{closed-cell} > (Z/A)_{open-cell} \text{ when } a>b; \quad (5)$$

$$(Z/A)_{closed-cell} < (Z/A)_{open-cell} \text{ when } a<b. \quad (6)$$

For trench DMOS transistors of all voltage specifications and for planar low-voltage DMOS transistors, the width of the silicon opening a is typically larger than the width of the trenches or polysilicon. Hence, to minimize the Z/A ratio, closed-cell designs are appropriate for trench devices of all voltage specifications. However, in a high-voltage DMOS transistor, the width of the silicon opening in a trench microcell is typically smaller than the width of the polysilicon in a planar microcell. Hence, to minimize the Z/A ratio, open-cell designs are appropriate for planar DMOS transistors that operate at high voltages.

In FIG. 4, a "modified" open cell 90 has body contacts of a predetermined width placed laterally at regular intervals and positioned perpendicular to the trenches 182. This enables lateral contact to the transistor body to occur. Unlike conventional open cells, the design of open cells 90 does not include body contacts or deep-body layers inside the cell, but have them placed laterally, at regular intervals. Also shown in FIG. 4 are parameters a, b, $c_1$, and $Z_1$, where a is the width of the silicon opening, b is the width of trench 182 or polysilicon, $c_1$ is the width of the p$^+$ region 180 provided for body contact, and $Z_1$ is the width of the source diffusion n$^+$ region. This design reduces dimension a, since it no longer has to accommodate the source, body, and contact line widths. In addition, from the stand point of area utilization, this design makes the open-cell construction superior to the closed-cell design. The perimeter to area Z/A ratio for this modified open cell design is given by the expression $$Z/A=[2/(a+b)] \times [1/(1+c_1/Z_1)]. \quad (7)$$

This function is plotted as curves 303–308 in FIG. 3, for the following $c_1/Z_1$ ratios=0, 0.1, 0.2, 0.3, 0.4, and 0.5.

Unfortunately, full use of this perimeter to area Z/A ratio advantage cannot be made. Under the ideal design option, the use of distant body contacts (i.e. using very small $c_1/Z_1$ ratio) ultimately leads to an open-body situation, where the source-body-drain structure forms an open-base bipolar transistor. A transistor built from these modified open cells and having distant body contacts can break down prematurely. This premature breakdown is termed "snap-back" breakdown. Hence, more closely spaced body contacts have to be provided (i.e. "snap-back" breakdown provides a lower limit constraining the ratio $c_1/Z_1$). An increased $c_1/Z_1$ ultimately makes the layout look similar to the one built from closed square cells.

The microcell density, also called packing density, is an alternate parameter for the characterization of the perimeter to area Z/A ratio of closed-cell designs, and is routinely measured in microcells per square inch. A state-of-the-art trench DMOS transistor built from hexagonal microcells, with a=10 μm has a microcell density of 4.77×10$^6$ microcells/square inch.

A higher-density process is generally considered a superior process, since it maximizes the perimeter to area Z/A ratio. Upon closer analysis, however, a large microcell density may not desirable by itself, since such density necessitates the presence of a large number of body/source contacts per unit area. In general, a higher contact density results in a lower reliability. Reliability is therefore of particular significance in a closed-cell power trench DMOS transistor, where the total number of body/source contacts per device is in the range of 100,000 to 500,000. Such a transistor supports currents in the range of 30 to 50 amperes.

In a power transistor formed by microcells, a disconnected source contact in one of the large number of microcells results not only in the loss from the total output current the contribution of the cell, a single disconnected body contact in one of the large number of microcells is enough to cause bipolar breakdown in that microcell, which, in turn, renders the transistor non-functional.

Thus, contrary to the object of a high packing density, the number of contacts per device limits minimization of the die size. Further, the range of prohibitive contact densities is reached sooner in trench designs than in planar designs, due to the small microcell sizes of trench designs. Moreover, a hexagonal microcell has an area that is 0.87 times smaller than the area of a square microcell with the same a and b dimensions. This is seen in the following equations:

$$(\text{Area})_{hexagonal} = [\sqrt{3}/2] \times (a+b)^2 = 0.87(a+b)^2; \quad (8)$$

$$(\text{Area})_{square} = (a+b)^2. \quad (9)$$

Therefore, to take advantage of finer lithography features, alternative microcell designs have to be considered. To maintain high reliability and yields, such alternative designs must reduce (not increase) the microcell density. In addition, such designs must not increase the specific on-resistance of the transistor. Although these requirements are apparently contradictory, they can be achieved simultaneously, since neither the packing density nor the perimeter to area Z/A ratio alone determine the specific on-resistance of a transistor.

The total on-resistance of a DMOS transistor is made up of various serially connected components, the most important of which are the channel resistance $r_{channel}$, the drift resistance $r_{drift}$, and the substrate resistance $r_{sub}$. The total on-resistance can be described by the following equation $$r_{ds(on)} = r_{channel} + r_{drift} + r_{sub}. \quad (10)$$

The relative contributions of these components of total on-resistance can be derived from numerical two-dimensional simulations of a DMOS transistor. FIG. 5a, which is also found in the article "Trench DMOS Transistor Technology for High-Current (100 A Range) Switching," Solid State Electronics, Vol. 34 No. 5, pp. 493–507, 1991, shows computer-simulated plots of the voltage distribution along the vertical line AB running from source to drain (see FIG. 5b, which shows a cross section of a trench DMOS transistor), through the channel and drift regions, in a conventional open-cell trench DMOS transistor where a=10 μm and b=2.5 μm. FIG. 5a shows curves 501 and 502, being the potential distribution of two microcells having breakdown voltages of 60 V and 120 V, respectively. These transistors are each formed on top of a 400 μm arsenic-doped substrate. From FIG. 5b, the contributions by the channel and drift regions to the total on-resistance of each of the DMOS transistors shown are as follows:

$$60 \text{ V transistor: } r_{channel}=54\%, r_{drift}=35\% \quad (11)$$

$$120 \text{ V transistor: } r_{channel}=23\%, r_{drift}=71\% \quad (12)$$

For each transistor, resistance in the substrate accounts for the remaining on-resistance of the DMOS transistor. Similar simulations for a 220 V microcell (not plotted) yield the following contribution by the channel and drift regions to the total resistance.

$$220\text{ V transistor: } r_{channel}=11\%, r_{drift}=87\% \tag{14}$$

SUMMARY OF THE INVENTION

In accordance with the present invention, two topologically different microcells are provided. Each of these microcells is designed to reduce the total number of contacts per device in mid- to high-voltage DMOS transistors. These cells or microcells use integrated connections between the source region and the body region, so as to be less sensitive to contact obturations such as those caused by particle contamination. Each of these cells comprises either an elongated hexagonal cell or a buried deep-body cell. Both cells are most efficiently used in high-current trench DMOS transistors, where the density of body contacts becomes prohibitive. The cells may, however, be implemented in planar DMOS transistors as well.

The invention will be more readily understood by reference to the drawings and the detailed description. As will be appreciated by one skilled in the art, the invention is applicable to power switching transistors in general, and is not limited to the specific embodiments disclosed.

DETAILED DESCRIPTION

The devices of the present invention can be fabricated in a conventional process, such as the manufacturing process described in the copending application, hereby incorporated by reference in its entirety, Ser. No. 07/762,103 entitled "Trench DMOS Power Transistor With Field-Shaping Body Profile And Three-Dimensional Geometry," by Constantin Bulucea et al., assigned to Siliconix Incorporated, which is also the assignee of the present application. Although the devices described herein are N channel devices, a person of ordinary skill will appreciate that P channel devices are also possible in accordance with the present invention.

Figure 6:
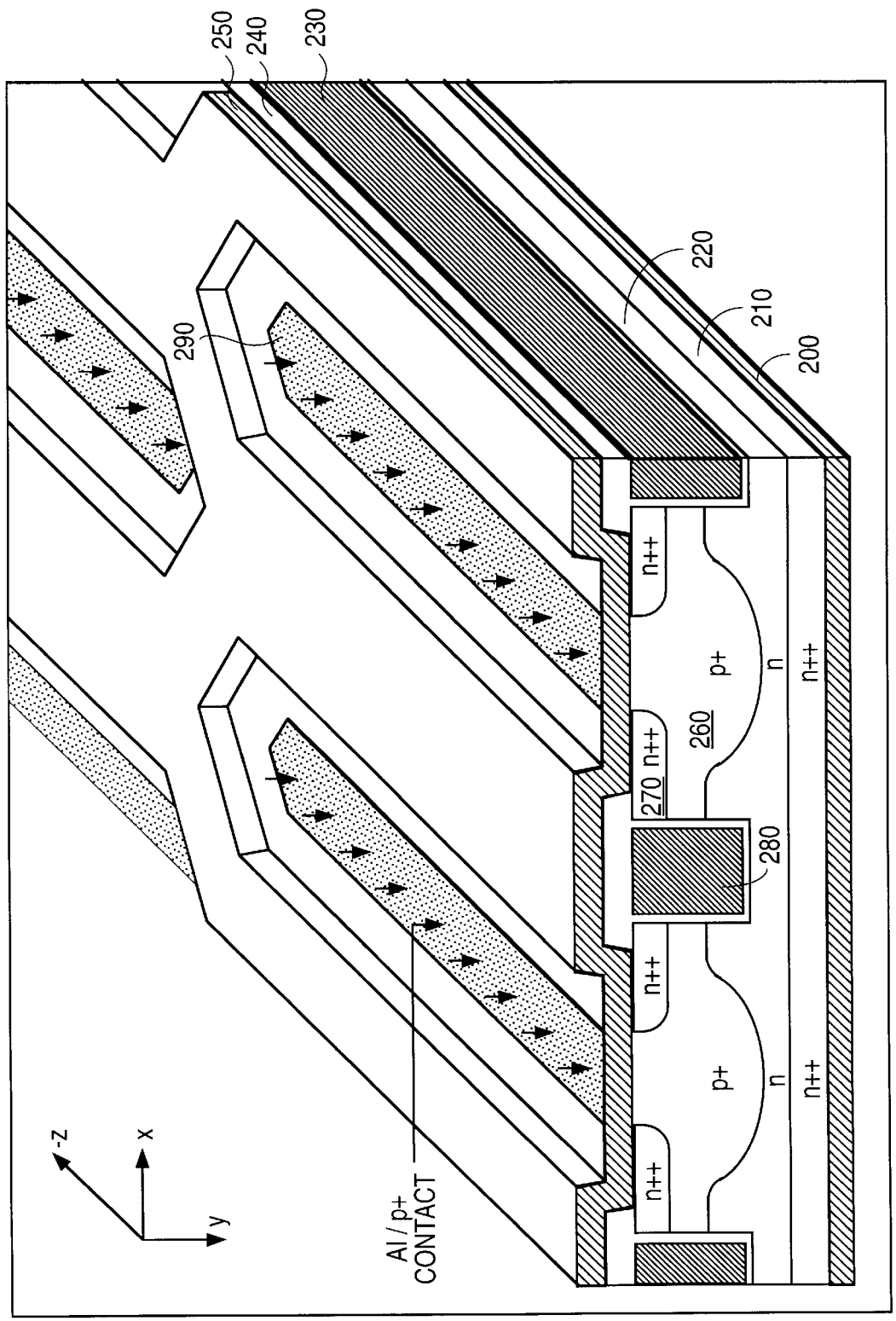
FIG. 6 shows a three-dimensional representation of an array of elongated hexagonal cells.

In one embodiment of the invention, the transistor cell has an elongated hexagonal shape. FIG. 6 shows a three-dimensional representation of an array of elongated hexagonal cells. The structure includes a heavily doped n-type (n+) substrate 210, on which is formed a lightly doped n-type epitaxial layer 220. Within the epitaxial layer 220 is a p-type body region 260. Another heavily doped n-type layer 270 overlying most of body region 260 serves as a source region.

Body region 260 opens to the top surface of the epitaxial layer 220 forming an exposed pattern 290 which is hexagonal when viewed in a horizontal cross section. This exposed pattern 290 is then contacted with a metal layer 250 (e.g. aluminum), as illustrated in FIG. 6 by the downward pointing arrows. In addition, as shown in FIG. 6, a metal layer 200 is formed on the back surface of the structure to provide a contact to the substrate. Using the coordinate system indicated in FIG. 6, each of these elongated hexagonal cells can be seen as a regular hexagonal cell that is stretched along the −z axis. The advantage of the hexagonal cell design, i.e., the uniformity of the gate oxide electric field, is fully maintained. In addition, as a result of the elongated hexagonal shape, the cell has an asymmetry which allows it to be less susceptible to body-contact failures, such as illustrated in FIG. 7.

Figure 7B:
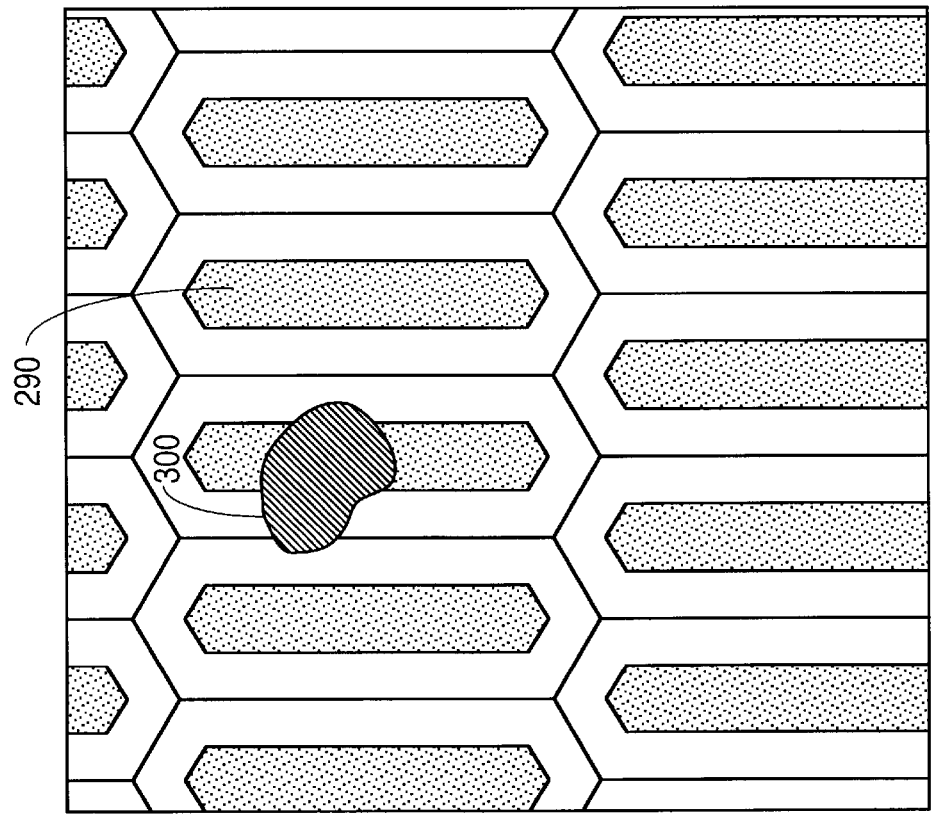
FIG. 7 illustrates the effects of particle contamination in transistors formed by (7a) regular hexagonal cells and (7b) elongated hexagonal cells, showing that, in the case when particle contamination obstructs contact formation completely in a regular hexagonal cell, contact is still possible in an elongated hexagonal cell.
Figure 7A:
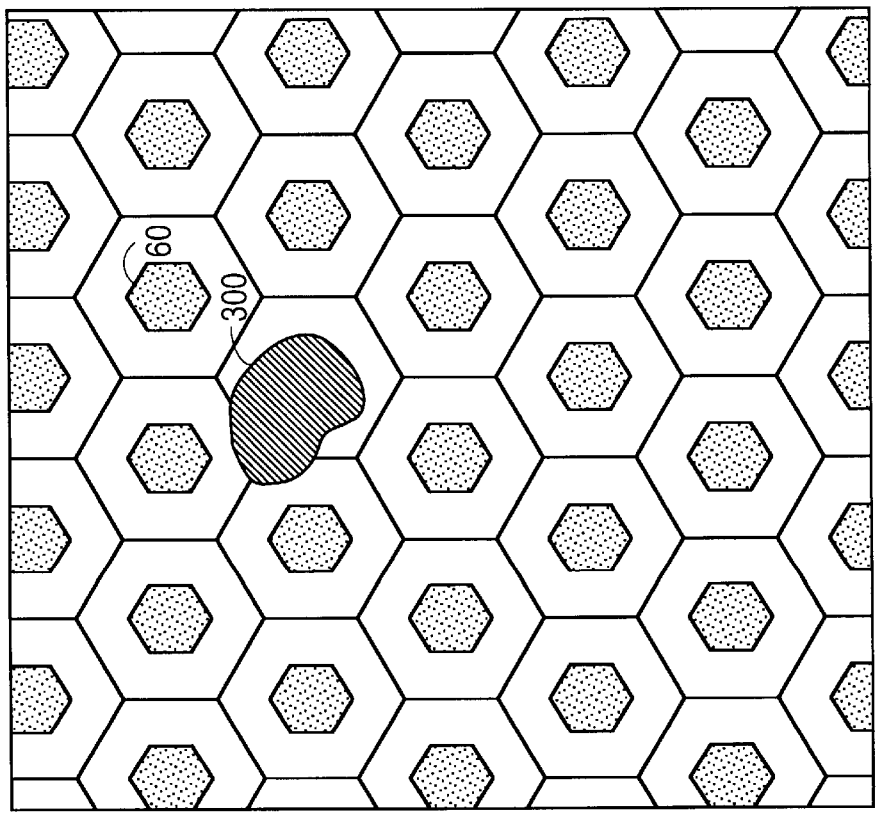

FIG. 7 compares a transistor formed by regular hexagonal cells (7a) to one formed by elongated hexagonal cells (7b), in the condition where a particle 300 of the size of the contact width a has landed in the contact area. This can be more fully understood by viewing FIGS. 7 and 6 simultaneously. In the regular-hexagonal cell illustrated in FIG. 7a, the particle 300 covers the entire contact area 60 so as to prevent the formation of a reliable electrical contact, thus rendering the whole transistor nonfunctional because of a possible bipolar breakdown. In the elongated hexagonal cell illustrated in FIG. 7b, however, because of the asymmetry in the shape of the microcell, the same particle 300 affects only a portion of the long contact 290, allowing a good electrical contact to be made with the remainder of the deep-body area. Moreover, the portion of the body region where the contact obturation takes place is still integrally connected to the source metallization layer through the low-resistivity $p^+$ layer 260, as illustrated in FIG. 6. As shown in FIG. 6, the elongated hexagonal cell contains an integrated body-source metallization short in which the $p^+$ layer 260 acts as a conductive material in parallel with the source metallization 250 (aluminum). Therefore, metallization layer 250 is still in integral connection with the $p^+$ as a result of the remaining body length available even with presence of the particle on a portion of the $p^+$ region.

In a regular hexagonal cell, an occasional lithography failure which occurs at the deep-body masking step may also result in the failure to form a reliable electrical contact. The surface-tension forces, acting upon the photoresist developer or oxide etcher from all six sides of a small hexagonal opening created in it, can cause poor "wetting" of that opening. This wetting tends to close the opening, resulting in an unopened oxide layer occluding body. In contrast, the total obturation by unopened oxide occluding the $p^+$ opening 290 is less probable with elongated cells, where a better "wetting" of the developer or etchant results.

Figure 8:
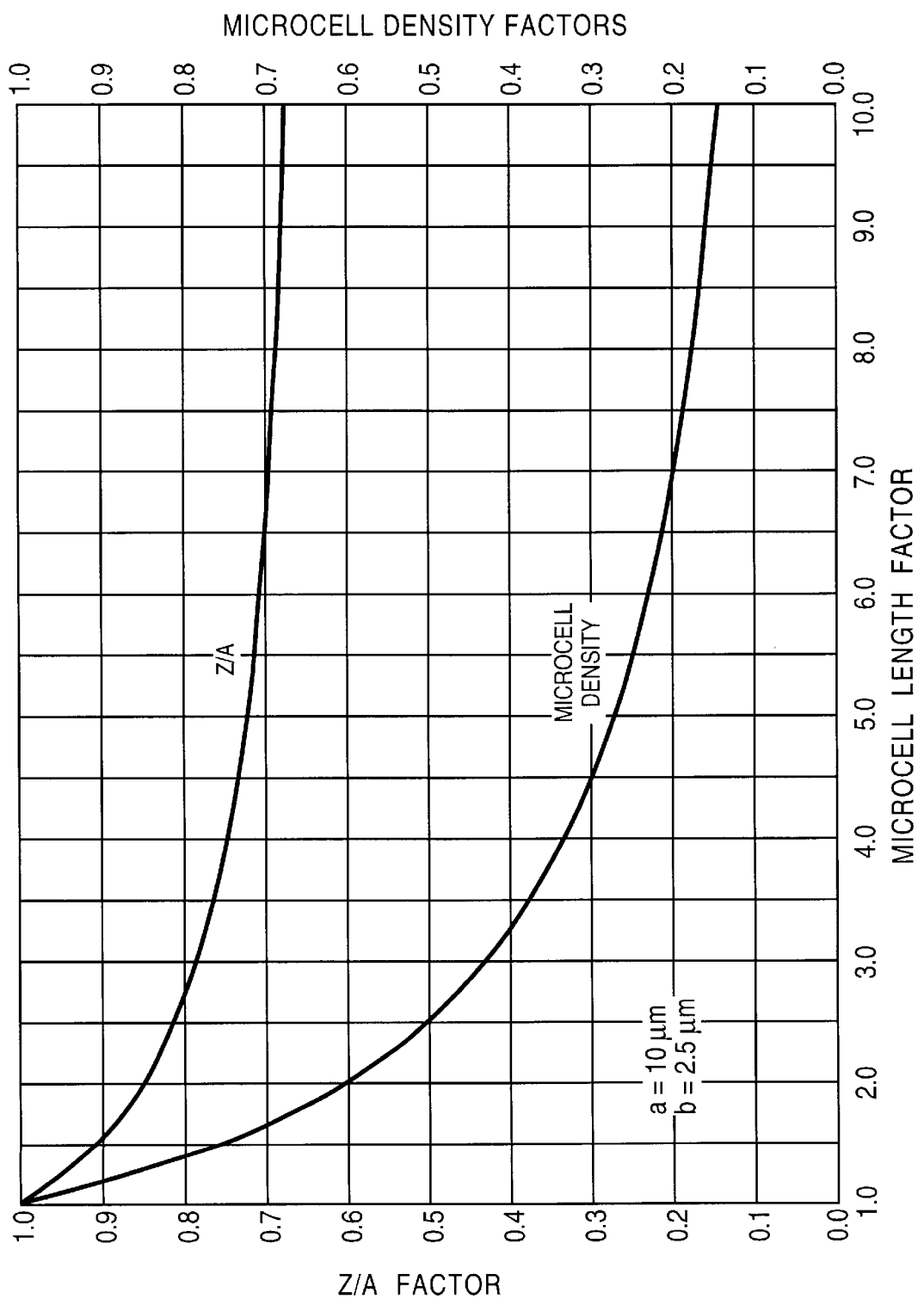
FIG. 8 illustrates (a) the perimeter to area Z/A ratio and (b) MICROCELL DENSITY factors of the elongated hexagonal cell versus the MICROCELL LENGTH factor, normalized to the corresponding parameters of the hexagonal microcell of FIG. 1.
Figure 9:
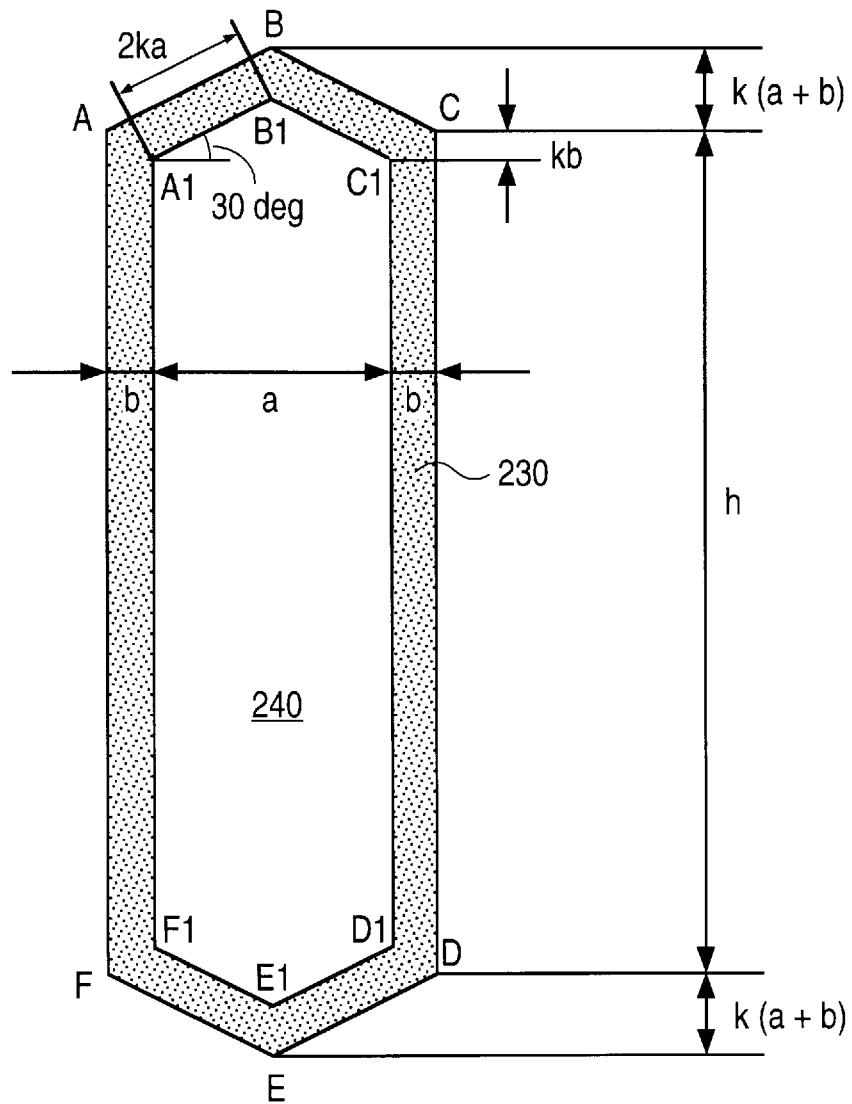
FIG. 9 shows an elongated hexagonal cell, and the perimeter and area parameters.

FIG. 8 illustrates the design parameters (i) perimeter to area Z/A ratio and (ii) microcell density, of an elongated hexagonal microcell versus the width h of the cell, normalized to the corresponding parameters in a regular hexagonal cell. As shown in FIG. 8, the elongated hexagonal cell has a slightly smaller perimeter to area Z/A ratio than a regular hexagonal cell, and a smaller microcell density, or density of body contacts. The width h of the cell is defined in FIG. 9, which shows an elongated hexagonal cell and the parameters which characterize such a cell. Parameters "microcell length factor," "Z/A factor" and "microcell density" are defined and calculated as follows for an elongated hexagonal microcell.

$$\text{MICROCELL LENGTH FACTOR} = x = h/[2k(a+b)], \quad (14)$$

where $$k = (1/2)\tan(30°) = \sqrt{3}/6 = 0.288675. \quad (15)$$

$$\text{Z/A FACTOR} = \frac{(Z/A)_{elongated\ hexagonal}}{(Z/A)_{hexagonal}} = \frac{[(a+b)x + (2a-b)]}{(2ax+a)} \quad (16)$$

The microcell density factor and the Z/A factor are plotted against the microcell length factor x in FIG. 8 for the following values of the design parameters a and b:

$$\text{MICROCELL DENSITY FACTOR} = \quad (17)$$

$$\frac{(\text{MICROCELL DENSITY})_{elongated\ hexagonal}}{(\text{MICROCELL DENSITY})_{hexagonal}} = \frac{3}{(2x+1)}$$

a=10 µm, and =2.5 µm.

In one embodiment of the present invention, an increase in cell length by a factor of 2.5 ensures the transistor against contact failures caused by particles of the size of the contact width, and reduces the microcell density down to half of the corresponding value for a regular hexagonal microcell. In this embodiment, the Z/A ratio is reduced by a factor of 0.81, which increases the channel specific resistance by a factor of 1/0.81=1.23. For a 120V (220V) transistor, this factor applies only to 23% (11%) of the total on-resistance, resulting in an increase in the total on-resistance from the regular hexagonal value, $(r_{ds(on)} \times A)_{hexagon}$, to $$(r_{ds(on)} \times A)_{elonated\ hexagonal} = (1.23 \times 23\% + 71\% + 6\%) \times (r_{ds(on)} \times A)_{hexagonal} \quad (18)$$

i.e., $$(r_{ds(on)} \times A)_{elongated\ hexagonal} = 105.3\% \ (r_{ds(on)} \times A)_{hexagonal} \quad (19)$$

in a 120 V transistor, and, analogously, $$(r_{ds(on)} \times A)_{elongated\ hexagon} = 102.5\% \ (r_{ds(on)} \times A)_{hexagonal} \quad (20)$$

in a 220 V transistor.

Hence to achieve the same on-resistance as in a transistor built with regular hexagonal cells, a 120 V (220 V) transistor built with elongated hexagonal cells requires an active area increase of 5.3% (2.5%) from the regular hexagonal cells. This increase in area is generally acceptable in the applications of these transistors.

The elongated hexagonal cells may also be used in a low-voltage (60 V) transistor, where the active-area increase is 12.5%. Such an area increase is also generally acceptable, considering the enhanced yield and reliability due to the lower incidence of contact failure.

Figure 10:
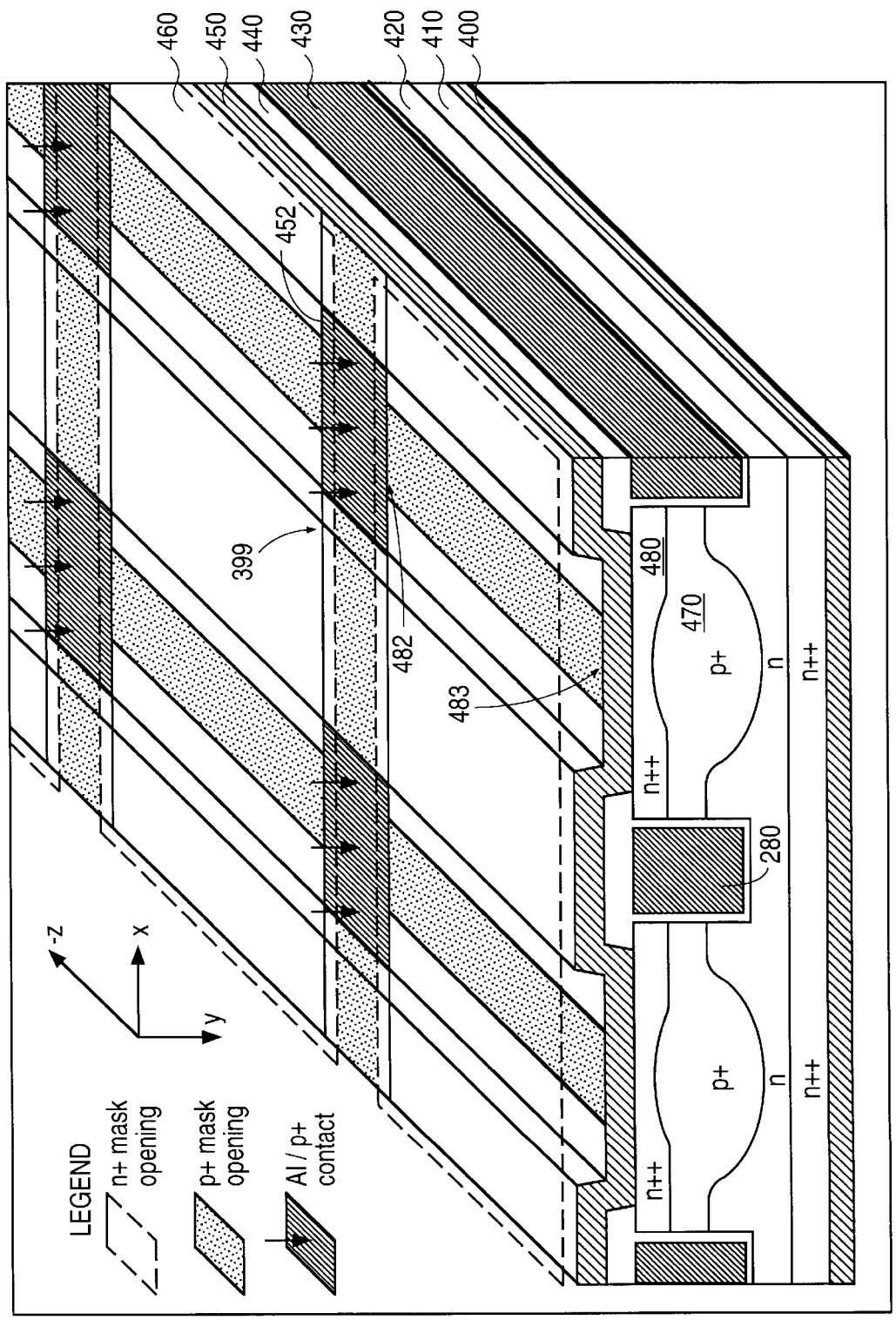
FIG. 10 shows a three-dimensional representation of an array of buried deep-body cells.

In accordance with another aspect of the invention, a buried deep-body cell is provided. FIG. 10 shows a three-dimensional representation of an array of buried deep-body cells. As shown in FIG. 10, a buried deep-body cell is fabricated on a heavily doped n-type substrate 410 having a heavily doped n-type epitaxial layer 420 in which is formed for each microcell a P-type body region 470, an n-type source region 480 and a metallization layer 450. In addition, there is a trench 430 extending downward from the surface of the cell and into the epitaxial layer 420 such that the bottom surface of the trench lies above a lowest part of the body region 470. An oxide layer 440 is present along the walls of the trench and insulates the polysilicon-filled trench which serves as the gate electrode of the transistor formed by the microcell.

Figure 1:
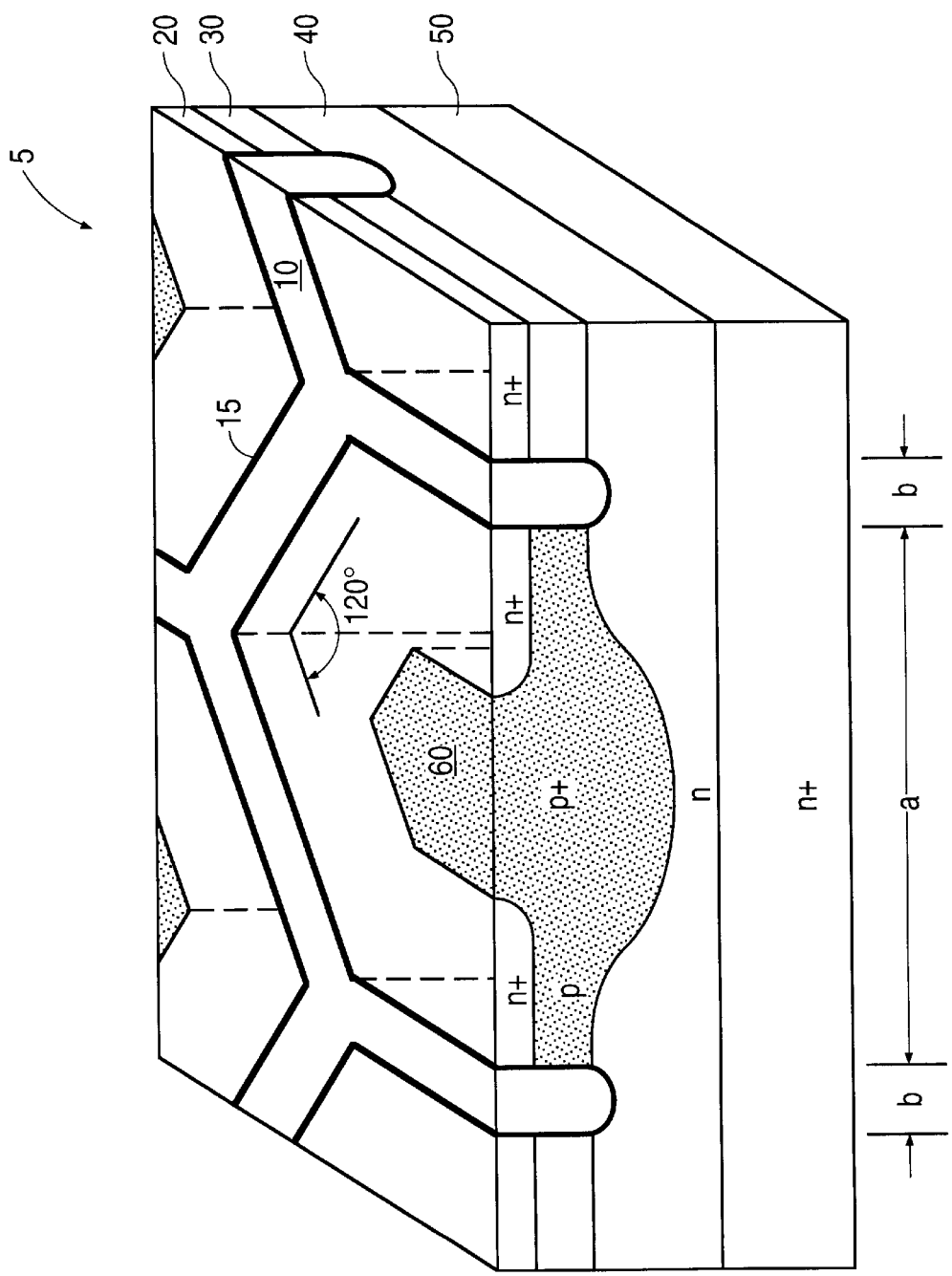
FIG. 1 illustrates a three-dimensional representation of a hexagonal trench DMOS microcell.
Figure 2:
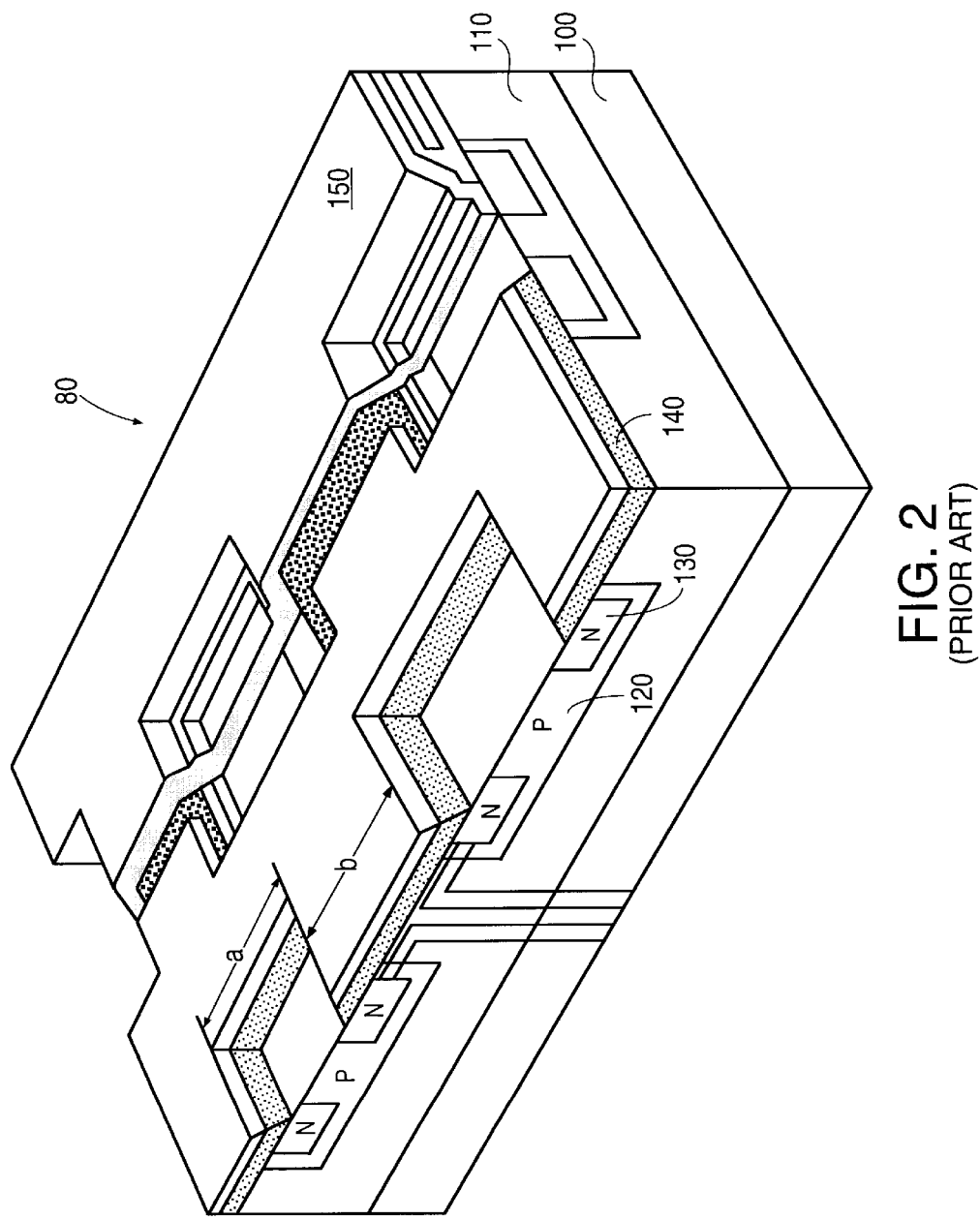
FIG. 2 illustrates a simplified three-dimensional representation (deep-body omitted) of a square planar microcell.
Figure 3:
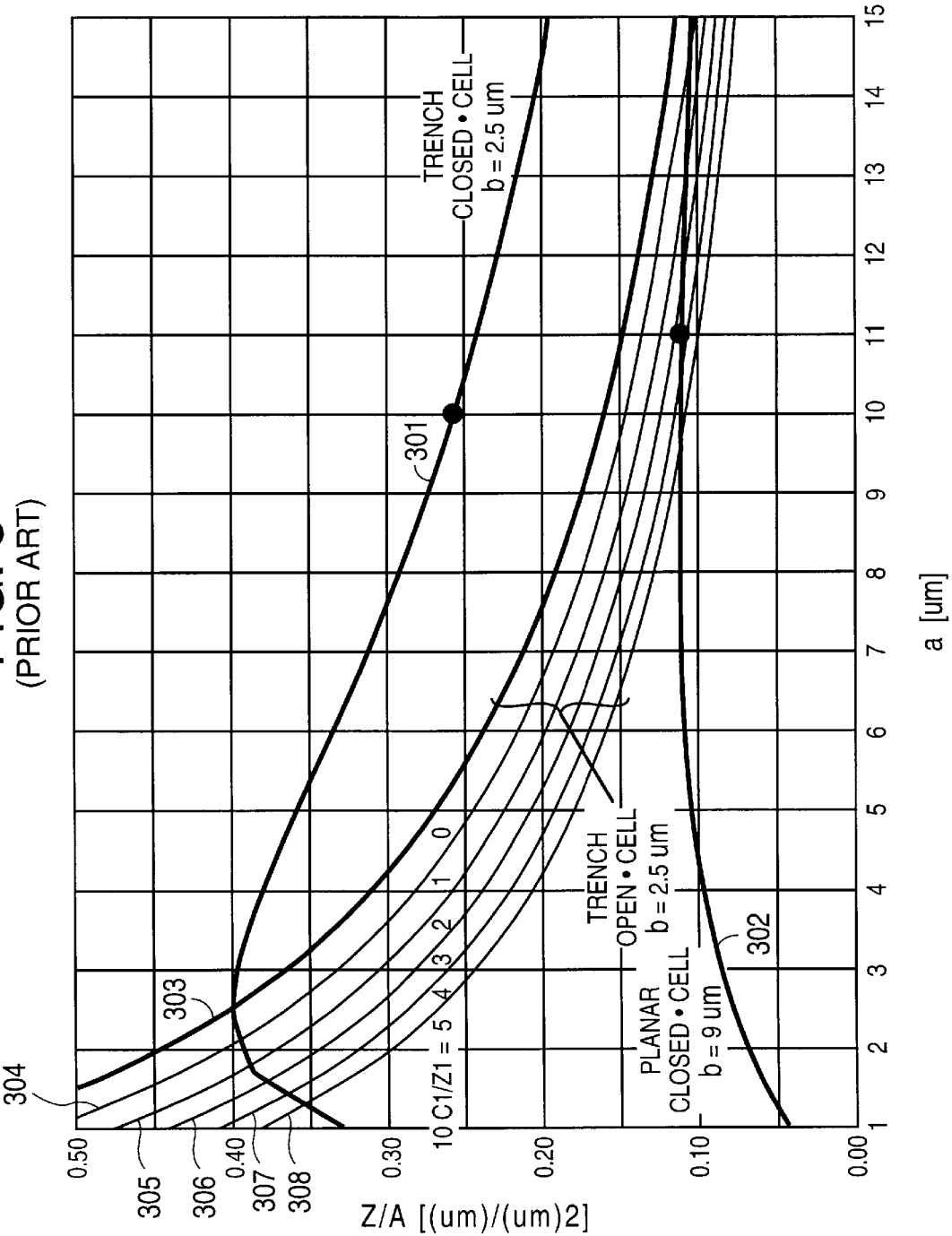
FIG. 3 plots the perimeter to area Z/A ratios for various typical open and closed cells of trench and planar transistor types.
Figure 4:
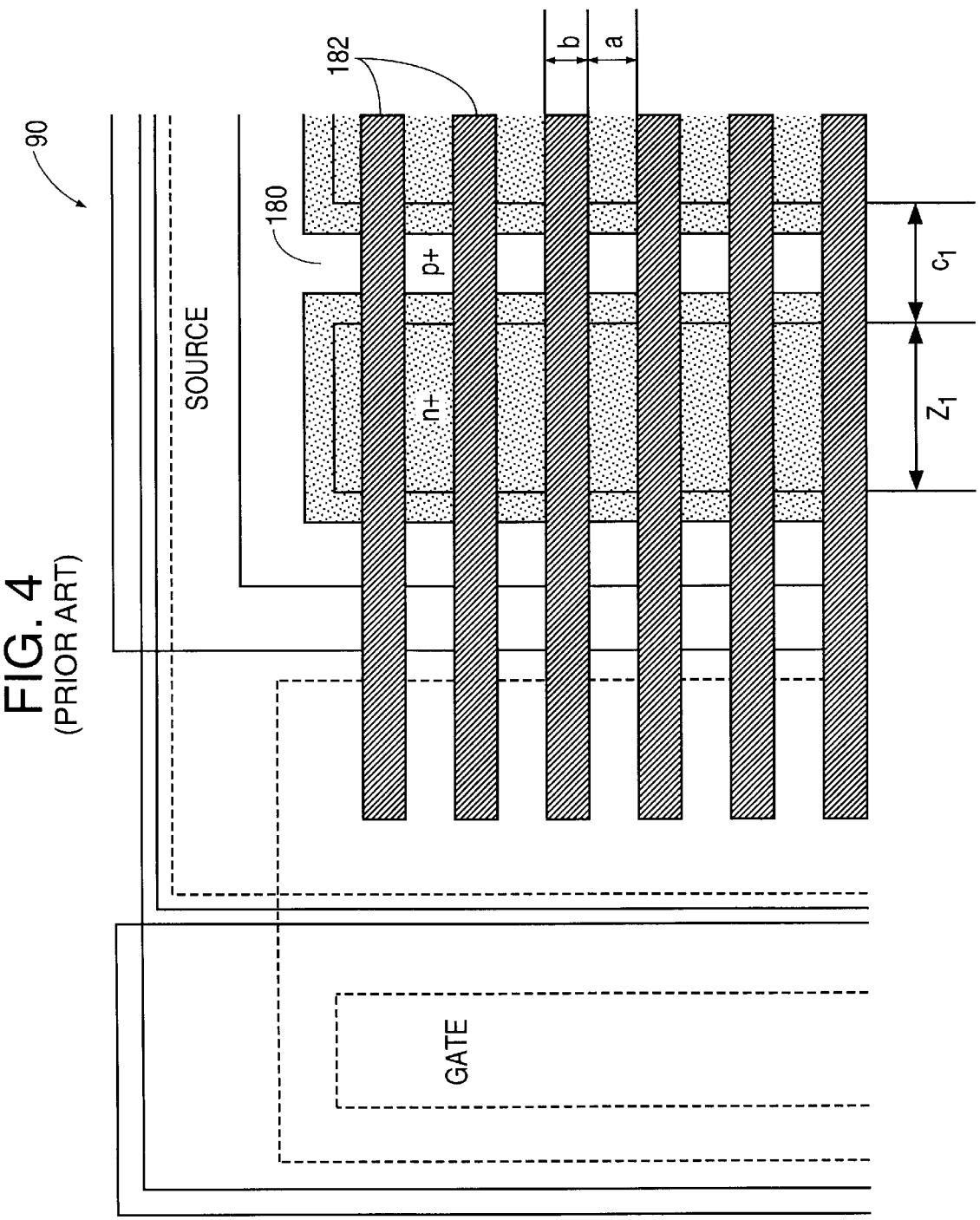
FIG. 4 illustrates a "modified" open-cell microcell showing various parameters of the microcell.
Figure 5A:
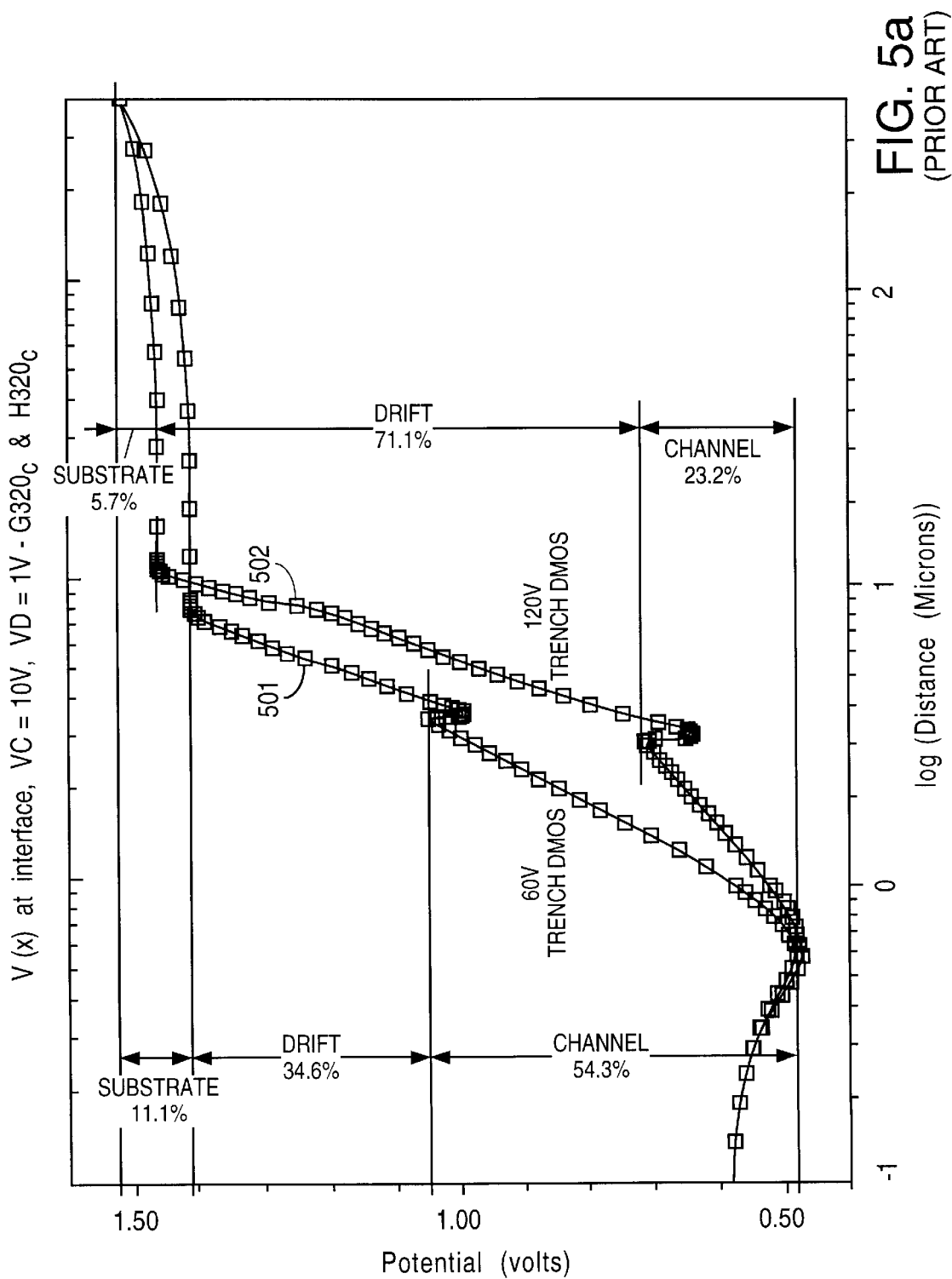
FIG. 5a plots, for two microcells, the voltage distributions along the source-drain line of each of two trench DMOS transistors formed by the respective microcells, showing the relative contributions of the resistances of the channel, drift and substrate components to the total on-resistance.
Figure 5B:
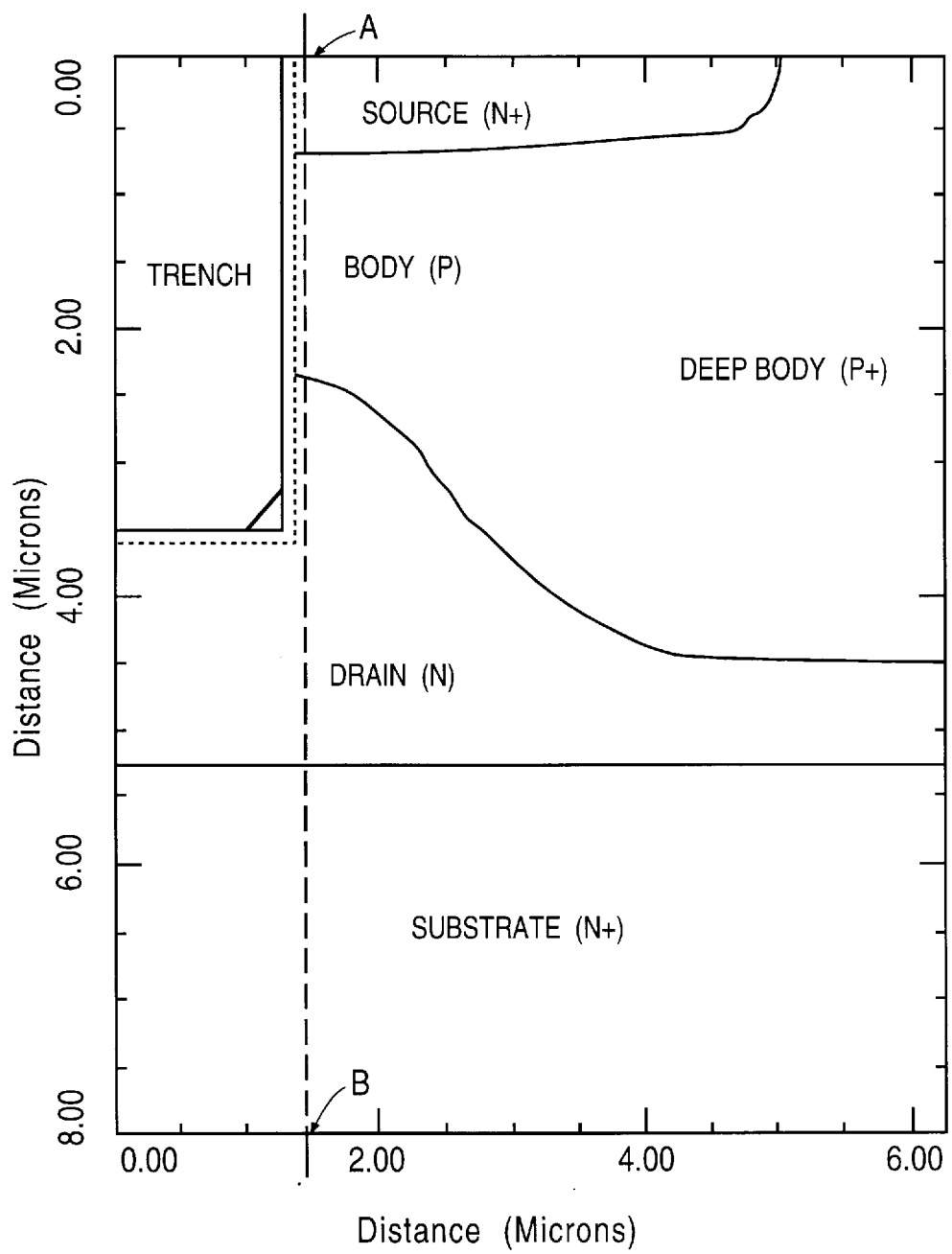
FIG. 5b shows a cross section of a microcell in a trench DMOS transistor, showing in particular the source-drain line AB along which the voltage distributions of FIG. 5a are obtained.

The buried deep-body cell embodiment 399 of FIG. 10 has an open-cell (stripe or linear) configuration. However, unlike the previously described modified open-cell configuration of FIG. 4, in the buried deep-body cell of the present invention, the deep-body layer 470 is located inside the cell. This deep-body region 470 does not open to the surface of the cell surrounded by the source region 480 to allow the formation of a contact directly from the surface of the microcell to the deep-body region 470. Rather the contact between the deep body region 470 and the source metallization region 452 occurs laterally along the longitudinal direction of the cell, at the top and bottom tips 482 and 483 of the cell, where the deep body region is masked during the source region implant. The presence of a mask against the source region implant prevents the formation of the source region (an $n^+$ layer) above the $p^+$ body region in the area occluded by the mask. Consequently, the $p^+$ layer is available for direct contact with the metallization layer 450. Note that source region 480 is formed by creating a higher surface concentration of the source region ($n^{++}$) 480 than the surface concentration of the deep-body region ($p^+$) 470, as is typically used in DMOS transistors. Hence, the superimposed source and deep-body implants result in n-type doping in the source region 480, leaving the $p^+$ body region 470 buried underneath the $n^{++}$ source region 480.

In this embodiment, the microcell uses integrated body-source metallization connections provided by the buried body layer running laterally. The p-type body region 470 is connected laterally to the source metallization rather than the traditional vertical body-source metallization contact. Furthermore, this embodiment of the invention has the advantage of reducing dimension a (i.e. the width of p-body opening) to the minimum that is required for insuring acceptable separation between the channel region and the $p^+$ deep-body region 470.

As a possible implementation of this invention, at b=2.5 µm, dimension a can be reduced to a=6 µm, with manageable intrusion of the $p^+$ profile into the channel region. Assuming $c_1/Z_1=0.1$, this results in Z/A=0.21, which represents a reduction of the Z/A ratio by a factor of 0.84, or an increase of the channel specific resistance by a factor of 1.20, compared to the regular hexagonal cell.

Following the same calculation methodology set forth in equations 19–21 for the first embodiment, the following values for the total on-resistance are obtained:

$$(r_{ds(on)} \times A)_{buried} = 104.6\% \ (r_{ds(on)} \times A)_{hexagonal}, \quad (23)$$

in 120 V transistors, and $$(r_{ds(on)} \times A)_{buried} = 102.2\% \ (r \times A)_{hexagonal,} \quad (24)$$

in 220 V transistors.

In this embodiment, using a value for $Z_1=50 \ \mu m$, the microcell density is cut down to 1/3.5 of the density of a comparable transistor built with regular hexagonal microcells.

The interval at which the deep-body to source metallization contacts 452 are placed has an upper limitation imposed by the "snap-back" breakdown caused by the parasitic n-p-n transistor formed by the source region 480, body region 470, and drain region 410. Snap-back breakdown takes place due to the voltage drop created by the avalanche current of the body-drain junction across the finite resistance of the p body region 470. At a high enough avalanche current, the source-body junction is turned on, activating the n-p-n transistor and bringing the transistor into the undesirable bipolar or "snap-back" breakdown mode.

The maximum value of the width $Z_1$ of the source region 480 is set by the resistivity of the body region 470 and by the minority-carrier lifetime in the body region 470. Low $p^+$ resistivity and high lifetime are required for increased $Z_1$ values.

Since the minority-carrier lifetime is a process-dependent material property and is rather difficult to predict, the most efficient estimate of the maximum $Z_1$ value, for a given process, is determined empirically using a test pattern.

Figure 11:
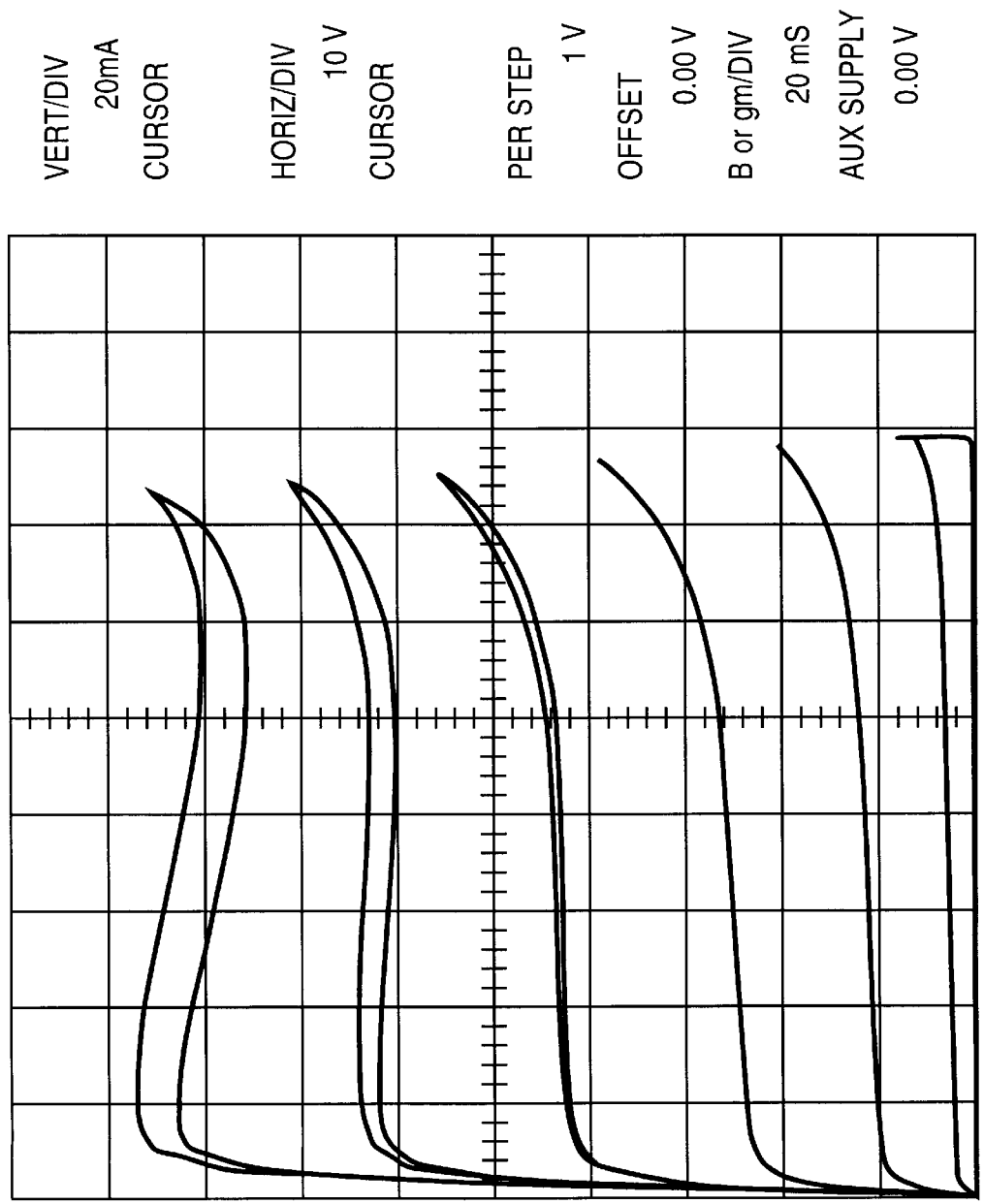
FIG. 11 shows the output current characteristics versus source voltage of a test-pattern transistor built with buried deep-body cells each having a source diffusion region with a width $Z_1=70$ μm.

FIG. 11 shows the output current characteristics of a test-pattern transistor built in accordance with the present invention, having $Z_1=70 \ \mu m$. The transistor operates without "snap-back" breakdown up to very high avalanche currents, up to and including the range where local mobility degradation effects show up under pulse conditions[1]. The I/V characteristics shown in FIG. 11 show that a transistor of the present invention having $Z_1=70 \ \mu m$ can reliably operate without snap-back breakdown up to the maximum current indicated.

[1] Local mobility degradation effects, which are present in all commercial DMOS transistors, are manifested at very high current by a reduction in the instantaneous drain current, when the small volume of a transistor cell is rapidly heated during each pulse to a high temperature range. This phenomenon is illustrated in FIG. 11 by the negative resistance of the uppermost current v. voltage (I/V) characteristic curve obtained by on a curve tracer using a base current pulse. This uppermost I/V characteristic curve is indicative of the maximum current condition under which a transistor can reliably operate.

In the buried deep-body cell transistor shown in FIG. 10, unlike when $Z_1=70 \ \mu m$ (FIG. 11), when $Z_1=150 \ \mu m$, "snap-back" characteristics take place.

The buried deep-body cell of the present invention has a uniform electric field distribution in the gate oxide except at the trench bottom. Hence this microcell is expected to have a higher gate-breakdown voltage than the elongated hexagonal cell described above, and is recommended for applications where the gate breakdown specification is of primary importance. The buried deep-body cell design is also expected to generate lower yield losses arising from the shorting of the gate to the source region that usually occurs during the source metallization contact masking step. The lower yield loss is accomplished because, due to the availability of the entire gate-to-gate silicon area for the source metallization contact, this cell can be designed with larger clearance between the source contact and the gate.

In order to make full use of the advantages of the buried deep-body cell, the entire metallurgical profile of the trench DMOS transistor should preferably be as shallow as possible to reduce the lateral spreading of the deep-body dopant, thus making it possible to build more compact microcells or microcells of a smaller dimension.

At the same time, the elongated hexagonal microcells achieve relatively rugged or snap-back-free operation because the source metallization is shorted to the body region in every section of the body region.

The embodiments described above are intended to be exemplary and not limiting. Numerous modifications or variations within the scope of the present invention are possible. The present invention is defined by the claims which follow.

We claim:

1. An open DMOS field effect transistor cell formed in a semiconductor substrate comprising:

a trench structure provided along a boundary of said open DMOS field effect transistor cell;

a source region formed in said semiconductor substrate extending into said semiconductor substrate from a first portion of a surface of said semiconductor substrate adjacent said trench structure;

a drain region formed in said semiconductor substrate separated from said source region;

a substantially buried deep-body region formed between said source region and said drain region, said substantially buried deep-body region having (i) a contact portion extending from said surface of said semiconductor substrate into said semiconductor substrate at a second portion of said surface, said second portion comprising a plurality of regions in contact with said first portion and said regions spaced laterally, in a direction perpendicular to the direction of said trench structure, and (ii) a buried portion with a deep-body profile located underneath said source region;

a conductive layer formed on said surface of said semiconductor substrate electrically shorting said substantially buried deep-body region and said source region at said first and second portions of said surface.

2. The transistor cell of claim 1, wherein said substantially buried deep-body region constitutes a channel region between said source region and said drain region.

3. The transistor cell of claim 2, wherein said trench structure and said substantially buried deep-body region extend respectively first and second depths into said semiconductor substrate, wherein said first depth is less than said second depth.

4. The transistor cell of claim 1, said substantially buried deep-body region is formed prior to said source region is formed, and said second portion of said surface is masked when said source region is formed thereby exposing said buried deep-body region at said second portion of said surface.

5. A DMOS transistor formed by a plurality of transistor cells connected in parallel, each of said transistor cell being the open DMOS field effect transistor cell of claim 1.

6. A DMOS transistor as in claim 5, wherein said plurality of transistor cells are identical and arranged in a regular pattern, such that the first portions of said surface in said transistor cells are arranged in regular intervals.

7. The transistor cell of claim 1, wherein said transistor cell has a rectangular topology.

* * * * *